United States Patent [19]

Iguchi et al.

[11] Patent Number: 5,389,474
[45] Date of Patent: Feb. 14, 1995

[54] MASK FOR PHOTOLITHOGRAPHY

[75] Inventors: Katsuji Iguchi, Yamatokoriyama; Takashi Fukushima, Shiki; Hiroki Tabuchi, Nara, all of Japan

[73] Assignee: Sharp Kabushiki Kaisha, Osaka, Japan

[21] Appl. No.: 47,056

[22] Filed: Apr. 12, 1993

Related U.S. Application Data

[63] Continuation of Ser. No. 699,295, Apr. 16, 1991, abandoned.

[30] Foreign Application Priority Data

Apr. 19, 1990 [JP] Japan ................................. 2-105832
Jun. 28, 1990 [JP] Japan ................................. 2-171920

[51] Int. Cl.$^6$ ............................................. G03F 9/00
[52] U.S. Cl. ......................................... 430/5; 430/311; 430/313; 430/320
[58] Field of Search ................. 430/5, 311, 313, 320

[56] References Cited

U.S. PATENT DOCUMENTS 3,986,876 10/1976 Abita ............................ 96/96
5,045,417 9/1991 Okamoto ....................... 430/5

FOREIGN PATENT DOCUMENTS 395425 10/1990 European Pat. Off. .

OTHER PUBLICATIONS

IEEE Transactions on Electron Devices—vol. ED-29, No. 12, Dec. 1982, New York US pp. 1828–1836; Marc D. Levenson et al: "Improving resolution in photolithography with a phase-shifting mask".
Patent Abstracts of Japan—vol. 6, No. 112 (P-124)(990) 23 Jun. 1982, & JP-A-57 041639 (Fujitsu K.K.) 08 Mar. 1982.
Patent Abstracts of Japan—vol. 6, No. 137 (P-130)(1015) 24 Jul. 1982, & JP-A-57 060335 (Hitachi Seisakusho K.K.) 12 Apr. 1982.
Extended Abstracts, vol. 80-1, May 1980, Princeton, New Jersey pp. 637–638; Qiu Pei-Yong et al: "Fabrication of chrome mask by using an electron beam exposure system".
Patent Abstracts of Japan—vol. 5, No. 42 (P-53)(714) 20 Mar. 1981, & JP-A-55 163539 (Kiyuushiyuu Nippon Denki K.K.) 19 Dec. 1980.
Patent Abstracts of Japan—vol. 6, No. 66 (P-112 27 Apr. 192, & JP-A-57 006849 (Matsushita Electric Ind. Co. Ltd.) 13 Jan. 1982.
Patent Abstracts of Japan—vol. 9, No. 289 (P-405)(2012) 15 Nov. 1985, & JP-A-60 128447 (Fujitsu K.K.) 09 Jul. 1985.
Hasegawa, S.; Microelectronic Engineering Sep. (1989) 127–130 "Mask Contrast Enhancement Using Beveled edge in x-ray lithography".

*Primary Examiner*—Marion E. McCamish
*Assistant Examiner*—Mark A. Chapman
*Attorney, Agent, or Firm*—Nixon & Vanderhye

[57] ABSTRACT

A mask for photolithography having a transparent substrate which allows light having a predetermined wavelength to pass therethrough; an opaque pattern provided on said substrate for inhibiting the light from passing therethrough; and a stepped portion provided adjacent to said opaque pattern on said substrate and having an inclined area, said stepped portion being transparent for allowing the light to pass therethrough, which can be used in a photolithographic system in fabrication of semiconductor devices and the like.

11 Claims, 3 Drawing Sheets

MASK FOR PHOTOLITHOGRAPHY

This is a continuation of application Ser. No. 07/699,295, filed Apr. 16, 1991, now abandoned.

BACKGROUND OF THE INVENTION

1. Field of the Invention

The present invention relates to a mask used in a photolithographic system in fabrication of semiconductor devices and the like.

2. Description of the Prior Arts

ULSI semiconductor devices which have been produced in recent years assemble a large number of transistors and wirings in micron photolithography on a single silicon substrate. Used for formation of the patterns of the transistors and wirings in submicrons is a photolithographic technology, such as a stepper (step and repeat photolithographic system with demagnification), transferring a mask's pattern in a reduced size (usually to one fifth) onto a photosensitive resin (resist) layer formed on the silicon substrate of the semiconductor devices.

The photolithographic system (the stepper) which is now applied to mass production of 1 MB and 4 MB DRAM devices uses the mask patterns having the respective minimum line widths of 1.2 and 0.8 μm for each DRAM device, and generally adopts emission lines called g-light of 436 nm emitted by an ultra high-pressure mercury-vapor lamp, while emission lines called i-light of 365 nm emitted by the same lamp has been locally used.

It is expected that each of 16 MB and 64 MB DRAM devices intended to be produced in the future will use 0.6 to 0.5 μm and 0.4 to 0.3 μm of the minimum line widths, respectively. For mass production of these semiconductor devices, an advanced photolithographic technology with the higher resolution needs to be developed. In order to improve the resolution by using light of shorter wavelengths, use of the i-lines in place of the g-lines, and KrF excimer laser of 248 nm have been studied.

In the above photolithographic system using the mask comprising a transparent substrate made of quartz with an opaque pattern generally of a thin metal layer disposed thereon, light is applied to the mask from the back thereof and light flux passing through the mask is converged on the substrate to form an image in a reduced size through a projection lens. Contrast of the image on the substrate is deteriorated due to diffraction of the light at the mask pattern edge as the mask pattern size approaches specific wave-lengths of the light, resulting in the extremely poor resolution of the light in comparison with critical resolution defined by NA of numerical aperture of the projection lens and the wave-lengths of the light. A new method to improve a pattern structure on the mask, achieve a higher contrast of the image and remarkably improve the resolution of the photolithography has been proposed previously.

The above previously proposed method uses a mask called a phase shifting mask as exemplified in FIG. 5 which mask comprises a transparent quartz substrate 51 to admit light of any wavelengths, a chromium thin film 52 for obstructing applied light, and a transparent thin film 53 (phase shifting film) to admit applied light, the thickness $t_s$ of the thin film 53 having the following relationship with its refractive index n and wavelengths λ of applied light:

$$T_s = \lambda / \{2 \cdot (n-1)\} \quad (1)$$

which condition sets the phase of applied light passing through the thin film 53 to be shifted half the cycle of waves. The phase shifting mask also has an opening 54 provided as conventionally and fine apertures 55 adjacent to the opening 54. The fine apertures 55, 55' do not dissect image by themselves and are disposed with the phase shifting film 53.

Light from the opening 54 is shifted by 180° relative to light from the apertures 55, so that light wave diffracted from the opening 54 to its adjacent area is offset with light wave from the apertures 55. Accordingly, light on the projection area is restrained from effusing from the opening 54 to its adjacent area, thereby improving contrast of the projected image.

Hence, the phase shifting mask improves contrast of image projected on the resist layer to have the practical resolution largely improved. For preparation of the phase shifting mask, a first resist image for a chromium pattern is first drawn by use of electron beam lithographic system, and a second resist image is then drawn for defining a phase shifting film. As a result, the system has to conduct twice the electron beam drawing which takes longer time and also to align the first pattern with the second pattern with high accuracy, leading to a complex and expensive technology for preparation of mask.

To solve the problems, another phase shifting mask shown in FIG. 6 has been proposed, which comprises a transparent quartz substrate 61 to admit applied light of any wavelengths, a chromium film 62 obstructing the applied light and a phase shifting film 63 whose thickness satisfies the relationship of the foregoing formula (1). For preparation of the phase shifting mask, an opening 64 is first formed in a resist film (not shown) by use of electron beam lithographic system and the chromium film 62 is then etched and removed at the part of the opening 64, while the resist film is also removed. Next, a resist film for forming the phase shifting film 63 is formed and ultraviolet is applied from the back of the substrate to the resist film at the opening 64 which resist film is then developed and removed. The chromium film 62 is etched partially under the resist film to have an opening larger than the opening 64 and having a region 65 over which the resist film hangs. Light passing through the region 65 and that passing through the opening 64 are different in phase at 180° from each other, so that both light is offset with each other when they are overlapped in a projected image, thereby preventing the light from effusing from the region 64 to its adjacent part. Hence, dispersion of photo-intensity on an image formation surface is sharp to improve the practical resolution of photolithography.

The preparation method for this phase shifting mask does not need to increase times of drawing by electron beam lithographic system, in turn, the number of steps for preparation of the mask. However, since the resist film kept for forming the phase shifting film is fragile, it is hard to wash and remove foreign particles on the mask. Thus, the method is not practical.

The phase shifting masks as discussed above or related masks are disclosed in e.g., Japanese Patent Publication No. 62(1987)-50811, Japanese Unexamined Patent Publication Nos. 58(1983)-173744, 62(1987)-67514, 1(1990)-147457 & 1(1990)-283925 and IEDM 1989, p57 (New Phase Shifting Mask with Self-aligned Phase Shifters for a Quarter Micron Photolithography).

As seen from the above, the phase shifting mask previously proposed has the above problems in practical use, and any phase shifting masks simple in fabrication and having sufficient durability have been desired.

SUMMARY OF THE INVENTION

The present invention, provides a phase shifting mask for photolithography which comprises a transparent substrate to admit light of predetermined wavelengths(e.g., visible light or ultraviolet) for transferring a mask pattern which is opaque to light and formed on the substrate, a transparent portion adjacent to the opaque pattern is provided with a stepped portion having an inclined area, thereby providing a phase shifting mask simply fabricated and having durability. The present invention also provides a process for the preparation of the above phase shifting mask.

BRIEF DESCRIPTION OF THE DRAWINGS

FIGS., 1(a) to 1(c) illustrate the steps of a first exemplary method for forming a phase shifting mask having a stepped phase shifting film portion.

PREFERRED EMBODIMENT OF THE INVENTION

The stepped portion having the inclined area is formed to a height approaching the foregoing formula (1). A transparent film is formed to a thickness approaching the height of the stepped portion on an opaque pattern of relatively larger thickness in accordance with vapor phase CVD process, or by spin coating. In this case, the opaque pattern may be a thin film of single phase or a multi-layer of a thin opaque film and a transparent film or a resist pattern. The opaque pattern may be provided on the transparent substrate or by etching the transparent substrate.

Also, the stepped portion having the inclined area is formed by depositing or applying a transparent film of a thickness approaching the foregoing formula (1) on an opaque pattern of relatively larger thickness in accordance with vapor phase CVD process, or by spin coating followed by anisotropic etching to leave the transparent film on the side wall of the opaque pattern. In this case, the opaque pattern may be a thin film of single phase or a multi-layer of a thin opaque film and a transparent film. Also, the opaque pattern may be provided on the transparent substrate or by etching the transparent substrate.

Furthermore, the stepped portion having the inclined area may be formed by etching the opaque film of the opaque pattern and then tapering the surface of the transparent substrate to the thickness approaching the foregoing formula (1).

According to the present invention, it needs only formation of pattern by use of an electron beam lithographic apparatus which enables it to provide a self-aligned phase shifting region. The phase shifting region comprises a film deposited by CVD process or formed by spin coating or the transparent substrate itself, so that the region will be not damaged by the washing step of the mask and the like.

The mask of the present invention provides the inclined area on the border between the transparent region and the opaque region to allow phase shifting of the light passing through the phase shifting region to increase continuously from the transparent region to the opaque region. Hence, when the phase shifting at the edge of the transparent region is set to a value approaching 180°, the light passing through the transparent region is not unexpectedly decayed and only the edge of light flux passing through the transparent region can be sharply shaped up.

Example 1

Figure 1A:
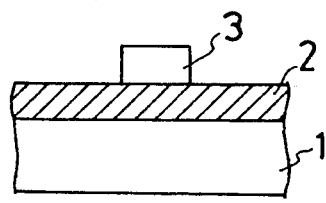

Hereinafter, an example of the invention will be described in conjunction with FIG. 1. A shield film 2 was deposited on a substrate 1 made of quartz, on which a resist layer to electron beam was formed followed by drawing thereon a predetermined pattern by use of an electron beam lithographic apparatus before development to obtain a resist pattern 3 (see FIG. 1(a)).

Figure 1B:
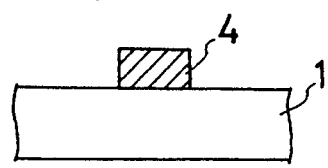

The shield film 2 was then etched by anisotropic etching using the resist pattern 3 as a mask to form an opaque pattern 4 followed by removing the resist layer (see FIG. 1(b)).

Figure 1C:
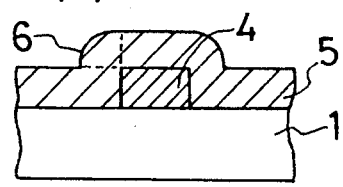

On the quartz substrate 1 having the opaque pattern 4 formed in the above step was deposited a transparent film 5 by CVD process to complete the mask fabrication process (see FIG. 1(c)).

The method in this example shapes the end of the opaque pattern 4 at an angle as extending almost vertically and the CVD film deposited on the stepped side wall portion by CVD process is used as the phase shifting film. The profile of the CVD film is a quarter arc as seen in FIG. 1(c) and the portion of the CVD film denoted by 6 serves as the phase shifting region.

In this example, an effective thickness of the phase shifting region at the edge of the opaque pattern is almost equal to that of the opaque pattern. Hence, the thickness of the shield film 2 was set in accordance with the foregoing formula (1). Lengths of the phase shifting region which has a relationship with the thickness of the transparent film 5 deposited on the side wall may be selectively set corresponding to the thickness of the transparent film 5. To be especially noted is the thickness of the stepped portion of the transparent film 5 which is likely to be thinner than the flat portion or varies depending on various CVD processes or systems applied.

In the process of fabrication of a phase shifting mask for the stepper using i-light (365 nm) in accordance with the present example, a double-layered metal film made of molybdenum(Mo)/Titanium(Ti) of 400 nm in total thickness was used as the shield film. Etching was conducted by use of reactive ion-etching system having parallel plates electrodes using reaction gas of carbon tetrachloride (CCl$_4$)+oxygen (O$_2$). Applied as the transparent CVD film was silicon oxide film (SiO$_2$) of 400 nm formed by normal pressure CVD process using material gas of silane (SiH$_4$)+oxygen (O$_2$). The thickness of oxide film on the side wall portion was about 300 nm.

The specific techniques for these processes are known in the art of fabrication of IC. Exposure test was conducted by use of the stepper with i-light of 0.45 of NA and using the phase shifting mask fabricated with the materials and the steps.

The phase shifting mask obtained in the present example had the line/space resolution of 0.35 μm improved more than 10% than the conventional mask exhibiting this resolution of 0.4 μm.

Various material and techniques other than the above may be used for this example. The shield film may be a metal film made of tungsten, chromium, cobalt, nickel, aluminum or the like, a silicon metal compound made of tungsten silicide (WSi$_2$), molybdenum silicide (MoSi$_{2Y}$) or the like, or a semiconductor film made of silicon alloy, silicon or the like. Any suitable etching techniques other than reactive ion etching may be applied depending on the material of the shield film. The shield film when using a metal such as molybdenum or the like may provide a pattern with the edge being inclined almost at 90° by use of liquid phase etching. Also, the transparent film may be a thin transparent film made of silicon-phosphorus glass, silicon-phosphorus-boron glass, silicon nitride or the like. Deposition may be conducted by reduced pressure CVD process, plasma CVD process or the like other than normal pressure CVD process. Furthermore, the transparent film may be a thin transparent film made of silicon-phosphorus glass, silicon-phosphorus-boron glass or the like formed by spin coating.

The shield film is not limited to a single opaque film and may be multi-layered with a transparent film and an opaque film. The transparent film is not limited to a single layer and may be multi-layered.

Example 2

Figure 7A:
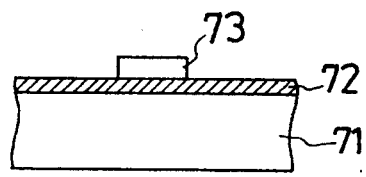
FIGS. 7(a) to 7(c) illustrate a still further exemplary method of forming a phase shifting mask wherein the opaque pattern includes an overlying resist pattern.

The second example of the invention will be described in conjunction with FIG. 7. A shield film 72 was deposited on a substrate 71 made of quartz, on which a resist layer to electron beam was formed followed by drawing thereon a predetermined pattern by use of electron beam lithographic system before development to obtain a resist pattern 73 (see FIG. 7(a)).

Figure 7B:
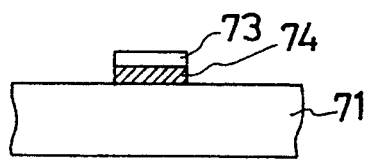

The shield film 72 was then etched by normal liquid phase etching using the resist pattern 73 as a mask to form an opaque pattern 74.(see FIG. 7(b)).

Figure 7C:
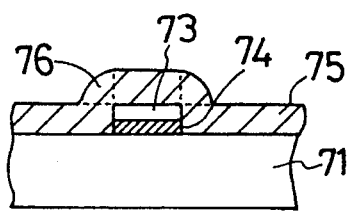

On the quartz substrate 71 having the resist pattern 73 and the opaque pattern 74 was deposited a transparent film 75 of SiO$_2$ by normal pressure CVD process using material gas of silane (SiH$_4$)+oxygen (O$_2$) to complete the mask fabrication process (see FIG. 7(c)).

The second example had the same result as that of Example 1.

The transparent film may be a thin transparent film made of silicon-phosphorus glass, silicon-phosphorus-boron glass, silicon nitride or the like other than the above SiO$_2$. Deposition may be conducted by reduced pressure CVD process, plasma CVD process or the like other than normal pressure CVD process. Furthermore, the shield film may be formed by selectively using various material, fabrication techniques and processing similarly with Example 1.

Example 3

Figure 8A:
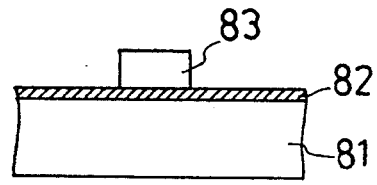
FIGS. 8(a) to 8(c) illustrate a still further exemplary process of forming a phase shifting mask having an opaque pattern and a thick overlying resist pattern; and, FIG. 9 is a schematic diagram showing the thickness of the SOG film.
Figure 8B:
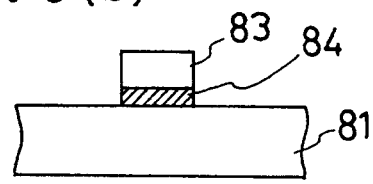

The third example of the invention will be described in conjunction with FIG. 8. A shield film 82 was deposited on a substrate 81 made of quartz, on which a resist layer to electron beam was formed followed by drawing thereon a predetermined pattern by use of electron beam lithographic system before development to obtain a resist pattern 83 (see FIG. 8(a)). The shield film 82 was then etched by normal liquid phase etching using the resist pattern 83 as a mask to form an opaque pattern 84.(see FIG. 8(b)).

Figure 8C:
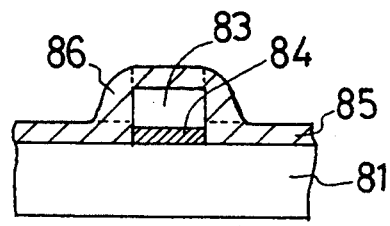

On the quartz substrate 81 having the resist pattern 83 and the opaque pattern 84 formed in the above steps was coated SOG followed by baking to form a transparent film 85 to complete the mask fabrication process (see FIG. 8(c)).

Figure 9:
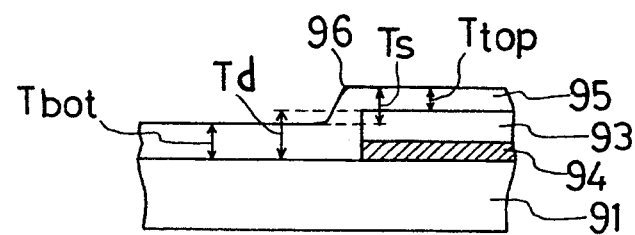

In this example, the edge of the resist pattern 83 and the opaque pattern 84 have preferably an angle as extending almost vertically. Also, the combination of the material for resist layer and SOG solution must not dissolve the resist layer upon coating of SOG solution. The SOG film at the stepped portion has an inclined feature as seen in FIG. 8(c), and the portion of the SOG film denoted by 86 serves as the phase shifting region. The maximum thickness Tm of the phase shifting region formed by spin coating of transparent SOG has a relationship with respect to difference of height Td between the opaque pattern part and the transparent part, the thickness of SOG film T$_{top}$ on the opaque pattern part and the thickness of SOG film T$_{bot}$ on the transparent part (see FIG. 9):

$$Tm = Td + T_{top} - T_{bot} \quad (2)$$

wherein the maximum thickness Tm of the phase shifting region is preferably almost equal to the thickness Ts of phase shifting film shown in the foregoing formula (1). In the fabrication process of a phase shifting mask for the stepper with i-light (365 nm) in this example, a posi-type resist of 500 nm was used for a resist layer forming the pattern of the shield film, and a double-layered metal film of chromium oxide/chromium (Cr) of 100 nm of total thickness was applied for the shield film. Etching of the shield film was conducted by normal liquid phase etching. Transparent SOG film of 1.46 of refractivity was applied by spin coating to obtain a phase shifting region in 300 nm of T$_{bot}$, 400 nm of Tm and 100 nm of T$_{top}$. The specific techniques for these processes are known in the art of fabrication of IC. Exposure test was conducted by use of the stepper with 0.45 of NA using the phase shifting mask fabricated with the above materials and the steps. The phase shifting mask obtained in the present example had the line/space resolution of 0.35 μm improved more than 10% than the conventional mask exhibiting this resolution of 0.4 μm.

Various material and techniques other than the above may be used for this example. The shielding film may be a metal film made of molybdenum, tungsten, chromium, cobalt, nickel, aluminum or the like, a silicon metal compound made of tungsten silicide (WSi$_2$), molybdenum silicide (MoSi$_2$) or the like, or a semiconductor film made of silicon alloy, silicon or the like. Any suitable etching techniques other than normal liquid phase etching may be applied depending on the material of the shielding film. The shielding film when using a metal such as molybdenum or the like may provide a pattern with the edge being inclined almost at 90° by use of reactive ion etching. Also, the transparent film may be a thin transparent film made of silicon-phosphorus glass, silicon-phosphorus-boron glass, or the like.

The shield film is not limited to a single opaque film and may be multi-layered with a transparent film and an opaque film. The transparent film is not limited to a single layer and may be multi-layered.

Example 4

The fourth example is different from Example 1 in that the surface of the substrate is etched to form a stepped portion.

Figure 2A:
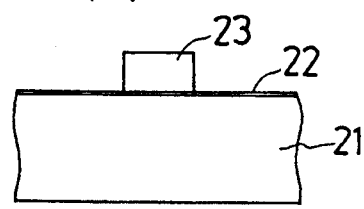
FIGS. 2(a) to 2(c) illustrate another exemplary fabrication process for a phase shifting mask wherein the surface of the substrate is etched to form a stepped portion.
Figure 2B:
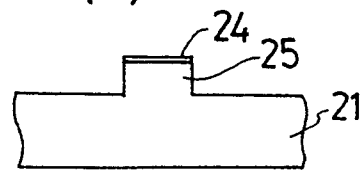

The example will be detailed with referring to FIG. 2. A shield film 22 was deposited on a substrate 21 made of quartz, on which a resist layer to electron beam was formed followed by drawing thereon a predetermined pattern by use of electron beam lithographic system before development to obtain a resist pattern 23 (see FIG. 2(a)).

The shield film 22 was then etched by normal liquid phase etching using the resist pattern 23 as a mask to form an opaque pattern 24. Also, the quartz substrate 21 was etched by reactive etching using the resist pattern 23 as a mask to form a pattern 25 followed by removing the resist pattern 23 (see FIG. 2(b)).

Figure 2C:
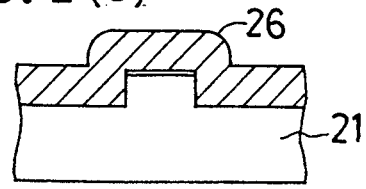

On the quartz substrate 21 having the opaque pattern 24 was deposited a transparent film 26 by CVD process to complete the mask fabrication process (see FIG. 2(c)).

In the example, the effective thickness of the phase shifting region on the edge of the opaque pattern is almost equal to the height of the opaque pattern part, so that an amount of etching on the substrate was set to that obtained by deducting the thickness of the shield film 22 from the height of phase shifting region determined by the foregoing formula (1). Also, lengths of the phase shifting region which vary depending on the thickness of the transparent film 26 deposited on the side wall portion are adjusted corresponding to the thickness of the transparent film 26.

This example had the same result as that of Example 1.

Material for the shield film, transparent film and the like, and fabrication and processing techniques thereof may be variously selected as in Example 1.

Example 5

The fifth example is different from Example 1 in that the transparent film is first deposited followed by etching the transparent film at the flat portion in accordance with anisotropic etching to leave the transparent film only on the side wall part of the opaque pattern.

The example will be detailed with referring to FIG. 3. A shield film 32 was deposited on a substrate 31 made of quartz, on which a resist layer to electron beam was formed followed by drawing thereon a predetermined pattern by use of electron beam lithographic system before development to obtain a resist pattern 33 (see FIG. 3(a)).

Figure 3A:
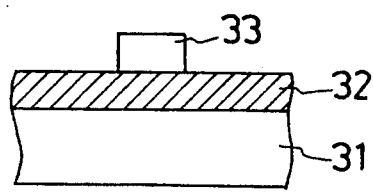
FIGS. 3(a) to 3(d) illustrate a still further exemplary process for forming a phase shifting mask which leaves a transparent film only on the side wall portion of the opaque pattern.
Figure 3B:
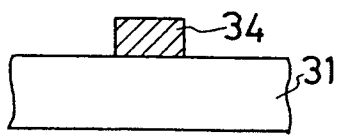

The shield film 32 was then etched by normal liquid phase etching using the resist pattern 33 as a mask to form an opaque pattern 34 followed by removing the resist pattern 33 (see FIG. 3(b)).

On the quartz substrate 31 having the opaque pattern 34 was deposited a transparent film 35 by CVD process.

Figure 3C:
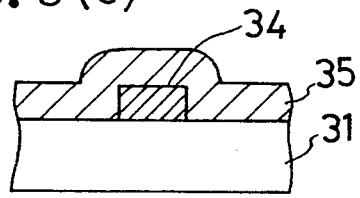
Figure 3D:
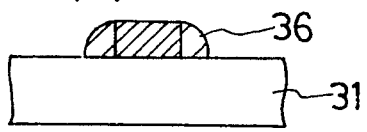

Finally, the transparent film 35 was etched back by reactive etching to leave the transparent film only on the side wall part to form a phase shifting region 36 before completion of the mask fabrication process (see FIG. 3(c)).

This example had the same result as that of Example 1.

Material for the shield film, transparent film and the like, and fabrication and processing techniques thereof may be variously selected as in Example 1.

Example 6

The sixth example is different from Example 1 in that an inclined area is formed on the border between the transparent part and the opaque part in the step of etching of the opaque pattern.

The example will be detailed with referring to FIG. 4. A shield film 42 was deposited on a substrate 41 made of quartz, on which a resist layer to electron beam was formed followed by drawing thereon a predetermined pattern by use of electron beam lithographic system before development to obtain a resist pattern 43 (see FIG. 4(a)).

Figure 4A:
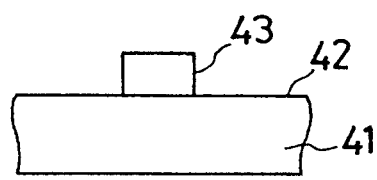
FIGS. 4(a) to 4(d) illustrate the steps of a still further exemplary process of forming a phase shifting mask wherein an inclined area is formed on the border between transparent and opaque portions when etching the opaque pattern.
Figure 4B:
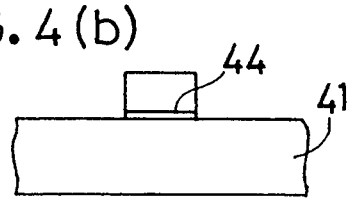
Figure 4C:
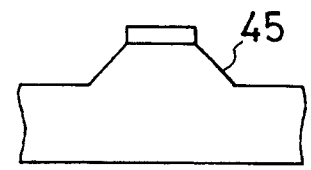

The shield film 42 was then etched by normal liquid phase etching using the resist pattern 43 as a mask to form an opaque pattern 44 (see FIG. 4(b)).

The quartz substrate 41 was etched by reactive etching using the resist pattern 43 as a mask to form a pattern 45. In the etching, the pattern must become larger as etching is proceeded. Etching of silicon dioxide is conducted generally by using reaction gas mainly made of $CF_4 + H_2$ or $CHF_3$. The gas is likely to form polymer in vapor phase. Hence, by suitably selecting conditions for etching, polymer is deposited on the side wall part to make thicker the resultant pattern and taper the etched part during etching. The known etching technique forms the inclined area 45 on the quartz substrate adjacent to the opaque region. (see FIG. 4(c)).

Figure 4D:
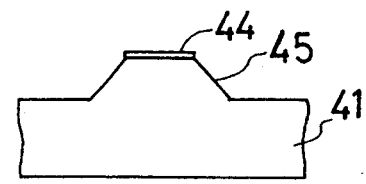
Figure 5:
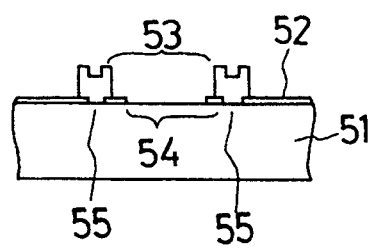
FIG. 5 shows a phase shifting mask of the prior art.
Figure 6:
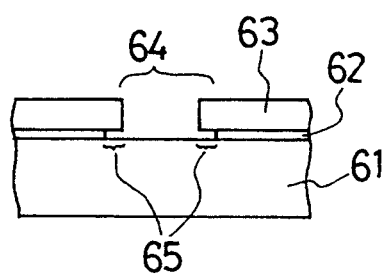
FIG. 6 illustrates a second prior art phase shifting mask.

Finally, the resist pattern 43 was removed to complete the fabrication of the phase shifting mask (see FIG. 4(d)) This example had the same result as that of Example 1.

As seen from the above, the present invention provides a mask for photolithography which comprises a transparent substrate to admit visible light or ultraviolet for transferring a mask pattern which is opaque not to admit the light and formed on the substrate, wherein a stepped portion having an inclined area is provided on the transparent part adjacent to the opaque pattern, so that drawing of the pattern by electron beam lithographic system is required only once, thereby allowing formation of a self-aligned phase shifting region. The phase shifting part is made of a SOG film, a CVD deposition film or the transparent substrate itself, thereby having little fear of being damaged in washing process or the like. Furthermore, the inclined area formed on the border between the transparent part and the opaque part allows phase shifting of light passing through the phase shifting part to be continuously increased from the transparent part to the opaque part. Hence, when the phase shifting At the edge of the transparent part is set to a value approaching 180°, only the edge part of light flux passing through the transparent part can be sharply shaped up without unexpectedly decaying the applied light as a whole, leading to a remarkable improvement of the resolution of photolithography in comparison with the conventional phase shifting mask.

What is claimed is:

1. A mask for photolithography comprising:
a transparent substrate which allows light having a predetermined wavelength to pass therethrough;
an opaque pattern provided on said substrate for inhibiting the light from passing therethrough;
a stepped portion formed on said substrate which includes at least said opaque pattern; and
a phase shift pattern comprising a transparent film formed over said substrate, said phase shift pattern also covering at least a side of said stepped portion;
the stepped portion having a height substantially equal to $\lambda/\{2(n-1)\}$ where $\lambda$ represents wavelength of light, and n represents a diffraction rate of the phase shift pattern;
whereby the phase shift pattern at a portion that adjoins the side of the stepped portion has a thickness greater than the thickness of the phase shift pattern on said substrate by $\lambda/\{2(n-1)\}$.

2. A mask according to claim 1 wherein the stepped portion is obtained by partially removing the opaque pattern and the substrate which is not covered with the opaque pattern.

3. A mask according to claim 1 wherein the phase shift pattern is formed over the substrate including the opaque pattern and the side of the stepped portion.

4. A mask according to claim 1 wherein the phase shift pattern is present only in the region that adjoins the side of said stepped portion.

5. A mask according to claim 1 wherein said stepped portion is formed of the opaque pattern and a resist layer used in the patterning of the opaque pattern.

6. A mask according to claim 1 wherein the stepped portion has a height of $\lambda/\{2(n-1)\}+(T_{bot}-T_{top})$ when the thickness of the transparent film grown on said substrate is different from the thickness of the transparent film grown on the opaque pattern where $T_{bot}$ represents the thickness of the transparent film on the substrate and $T_{top}$ represents the thickness of the transparent film on the opaque pattern.

7. A mask according to claim 1 wherein said opaque pattern is formed of one or more films selected from among a metal film such as tungsten, chromium, cobalt, nickel or aluminum, a silicon metal compound film or a semiconductor film such as silicon alloy or silicon.

8. A mask according to claim 1 wherein said substrate is made of quartz.

9. A process for manufacturing a mask for photolithography on a transparent substrate which allows light having a predetermined wavelength to pass therethrough, said process comprising:
(1) the step of forming an opaque film which inhibits light from passing therethrough;
(2) the step of forming a resist film to electron beam on said opaque film;
(3) the step of forming a resist pattern on said resist film by drawing a predetermined pattern with an electron beam lithographic apparatus and then developing the thus formed resist pattern;
(4) the step of forming a stepped portion having a height substantially equal to $\lambda/\{2(n-1)\}$ around said resist pattern by etching said opaque film to form an opaque pattern with said resist pattern serving as a mask by anisotropic etching and
(5) the step of laminating a transparent film on said substrate including said opaque pattern, by removing or without removing said resist pattern, whereby the area adjacent said stepped portion includes an inclined surface and is made transparent for allowing the light to pass therethrough.

10. A process for preparing a mask for photolithography as claimed in claim 9 wherein said laminated transparent film is removed except for the portion surrounding said resist pattern following said step (5).

11. A process for manufacturing a mask for photolithography on a transparent substrate which allows light having a predetermined wavelength to pass therethrough, said process comprising:
(1) the step of forming an opaque film which inhibits the light from passing therethrough;
(2) the step of forming a resist film to electron beam on said opaque film;
(3) the step of forming a resist pattern on said resist film by drawing a predetermined pattern with an electron beam lithographic apparatus and then developing the thus formed resist pattern;
(4) the step of forming a stepped portion having a height substantially equal to $\lambda/\{2(n-1)\}$ around said resist pattern by etching said opaque film and said substrate with said resist pattern serving as a mask by reactive etching; and
(5) the step of depositing a phase shifting film on said substrate after said stepped portion is formed vertical to said substrate, whereby the area adjacent said stepped portion includes an inclined surface and is made transparent for allowing the light to pass therethrough.

* * * * *